(12) United States Patent
Danioni et al.

(10) Patent No.: US 10,965,262 B2
(45) Date of Patent: Mar. 30, 2021

(54) INTERFACE ELECTRONIC CIRCUIT FOR A MICROELECTROMECHANICAL ACOUSTIC TRANSDUCER AND CORRESPONDING METHOD

(71) Applicant: STMicroelectronics S.r.l., Agrate Brianza (IT)

(72) Inventors: Alberto Danioni, Vittuone (IT); Alessandro Morcelli, Milan (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 59 days.

(21) Appl. No.: 16/378,872

(22) Filed: Apr. 9, 2019

(65) Prior Publication Data

US 2019/0326867 A1 Oct. 24, 2019

(30) Foreign Application Priority Data

Apr. 18, 2018 (IT) ........................ 102018000004665

(51) Int. Cl.
  *H03F 13/00* (2006.01)
  *H03F 3/70* (2006.01)
  *H04R 19/04* (2006.01)

(52) U.S. Cl.
  CPC .............. *H03F 3/70* (2013.01); *H04R 19/04* (2013.01); *H03F 2200/03* (2013.01); *H03F 2200/48* (2013.01)

(58) Field of Classification Search
  CPC . H03F 3/70; H03F 3/181; H03F 13/00; H03F 2200/03

(Continued)

(56) References Cited

U.S. PATENT DOCUMENTS 5,821,807 A * 10/1998 Brooks .................. G05F 1/461
                                                           327/540
9,329,610 B2    5/2016 David et al.
(Continued)

OTHER PUBLICATIONS

InvenSense, "Ultra-Low Current, Low-Noise Microphone with Analog Output," datasheet, ICS-40310, revised on Oct. 27, 2014, 14 pages.

(Continued)

*Primary Examiner* — Steven J Mottola
(74) *Attorney, Agent, or Firm* — Seed Intellectual Property Law Group LLP

(57) ABSTRACT

In at least one embodiment, an interface electronic circuit for a capacitive acoustic transducer having a sensing capacitor is provided. The interface electronic circuit includes an amplifier, a voltage regulator, a common-mode control circuit, and a reference generator. The amplifier has an input coupled to an electrode of the sensing capacitor. The voltage regulator is configured to receive a regulator reference voltage, generate a regulated voltage based on the regulator reference voltage, and supply the regulated voltage to a supply input of the amplifier. The common-mode control circuit controls a common-mode voltage present on the input of the amplifier based on a common-mode reference voltage. The reference generator receives a supply voltage and generates the regulator reference voltage and the common-mode reference voltage with respective values that are variable as a function of the supply voltage.

20 Claims, 4 Drawing Sheets

(58) Field of Classification Search
USPC .................................. 330/174; 381/120, 122
See application file for complete search history.

(56) References Cited

U.S. PATENT DOCUMENTS

| | | | |
|---|---|---|---|
| 9,571,046 B2 | 2/2017 | Fröhlich et al. | |
| 2011/0298537 A1* | 12/2011 | Homol | ................ H01L 27/0928 |
| | | | 330/124 R |
| 2013/0064397 A1 | 3/2013 | Dünser | |
| 2014/0079254 A1 | 3/2014 | Kim et al. | |
| 2016/0054747 A1* | 2/2016 | Cohen | ...................... G01K 7/00 |
| | | | 713/300 |

OTHER PUBLICATIONS

Knowles, "High-SPL Differential Bottom Port SiSonic™ Microphone," datasheet, SPA1687LR5H-1, 2016, 9 pages.
Knowles, "Precision High SNR Zero-Height SiSonic™ Microphone," datasheet, SPH1611LR5H1-1, Apr. 18, 2016, 10 pages.
STMicroelectronics, "High-performance MEMS audio sensor: fully differential analog bottom-port microphone," datasheet, MP23AB01DH, Nov. 2016, 12 pages.

* cited by examiner

INTERFACE ELECTRONIC CIRCUIT FOR A MICROELECTROMECHANICAL ACOUSTIC TRANSDUCER AND CORRESPONDING METHOD

BACKGROUND

Technical Field

The present disclosure relates to an interface electronic circuit, and to a corresponding method, for an acoustic transducer, in particular a capacitive microphone of the MEMS (Micro-Electro-Mechanical System) type, to which the following treatment will make explicit reference without this implying any loss of generality.

Description of the Related Art

As is known, an acoustic transducer of a capacitive type, in particular a MEMS microphone, in general comprises: a MEMS detection structure, provided in a first die of semiconductor material, typically silicon; a reading and biasing interface electronic circuit, typically provided as an ASIC (Application-Specific Integrated Circuit) in a second die of semiconductor material; and a package, inside which the two dies are housed, namely, that of the MEMS detection structure and that of the interface electronic circuit, and which is provided with a hole for entry of the acoustic pressure waves and with appropriate elements for electrical-connection between the interface electronic circuit and the outside of the same package.

In a known manner, the MEMS detection structure generally comprises a mobile electrode, made as a diaphragm or membrane, arranged facing a fixed electrode to provide the plates of a sensing capacitor with variable capacitance. The mobile electrode is generally anchored, by means of a perimeter portion thereof, to a substrate, whereas a central portion thereof is free to move or bend in response to the pressure exerted by the incident acoustic pressure waves. Bending of the membrane that constitutes the mobile electrode causes a variation of capacitance of the sensing capacitor as a function of the acoustic signal to be detected.

The interface electronic circuit has the function of electrically biasing the mobile and fixed electrodes of the sensing capacitor of the MEMS detection structure, and moreover of acquiring the capacitive-variation signal and converting it into an electrical output signal (in particular, of an analog type), which is supplied at the output from the acoustic transducer.

As is shown in FIG. 1, the aforesaid interface electronic circuit, designated by 1, is supplied by a supply voltage $V_{DD}$, at low voltage (for example, between 1.6 V and 3.6 V), and in general comprises: a charge-pump stage 2; an amplifier stage 4; a voltage-regulator stage 5; and a common-mode-control stage 6.

In detail, the charge-pump stage 2 receives the supply voltage $V_{DD}$ and a charge-pump reference voltage $V_{ref\_CP}$ and is configured to generate a boosted voltage $V_{CP}$ (for example, with a value between 15 V and 20 V), of a boosted value with respect to the supply voltage $V_{DD}$, for biasing the MEMS detection structure; in particular, the output of the charge-pump stage 2 is coupled to a first electrode $N_1$ (constituted, for example, by the mobile membrane) of the MEMS detection structure (represented schematically by the equivalent circuit of a capacitor $C_{MEMS}$ with variable capacitance), to which it supplies the boosted voltage $V_{CP}$.

A second electrode $N_2$ (for example, constituted by the rigid plate, or backplate) of the MEMS detection structure, is, instead, coupled to a high-impedance input of the amplifier stage 4, set at an input voltage $V_{in}$ (it should be noted that, in an evident manner, the input of the amplifier stage 4 may be differential, instead of "single-ended", as in the example illustrated).

The amplifier stage 4 has a supply input, which receives a regulated voltage $V_r$ from the voltage-regulator stage 5, having a regulated value, lower than, and close to, the supply voltage $V_{DD}$, and defining the maximum swing of the output voltage $V_{out}$ of the amplifier stage 4 (the so-called "rail-to-rail" swing). The output voltage $V_{out}$ is supplied on an output terminal Out of the interface electronic circuit 1, available from the outside of the package of the acoustic transducer (it should be noted that, in an evident way, the output of the amplifier stage 4 may be differential, instead of single-ended as in the example illustrated).

The voltage-regulator stage 5 receives the supply voltage $V_{DD}$ and moreover a regulator reference voltage $V_{ref\_reg}$ and is configured to generate the aforesaid regulated voltage $V_r$, having an appropriate value. In particular, the voltage-regulator stage 5 may be implemented by a regulator of the so-called LDO (Low Drop-Out) type, which is able to maintain the output voltage regulated with a minimal difference between the input voltage and the output voltage (and hence with a minimal energy dissipation).

The common-mode-control stage 6 receives a respective common-mode reference voltage $V_{ref\_CM}$ and is configured to determine the value of the common-mode (or DC) voltage $V_{CM}$ at the input of the amplifier stage 4, for example at a value that corresponds to approximately half of the regulated voltage $V_r$.

A reference generator, designated by 8 in FIG. 1, is configured to generate a stable reference, of a value fixed and set at the design stage, for generation of the aforesaid values of the charge-pump reference voltage $V_{ref\_CP}$, of the common-mode reference voltage $V_{ref\_CM}$, and of the regulator reference voltage $V_{ref\_reg}$, which are also fixed and pre-set.

In a known manner, the performance of an acoustic transducer is defined, among others, in terms of the following parameters:

AOP (Acoustic Overload Point), which is the amplitude of the input sound level for which the value of THD (Total Harmonic Distortion) at the output reaches 10% (input sound levels higher than that amount cause considerable distortion of the output signals);

SNR (Signal-to-Noise Ratio), which is the ratio between a reference signal (typically an input sound level equal to 94 dBSPL) and the corresponding output noise; and PSRR (Power-Supply Rejection Ratio), which is the capability of the interface electronic circuit to reject the noise present on the supply voltage $V_{DD}$ (typically calculated by superimposing a sinusoidal signal with amplitude 100 $mV_{pp}$ on the supply voltage $V_{DD}$).

The aforesaid parameters are mainly determined by the characteristics of the interface electronic circuit 1, which has to be accurately designed and optimized, as a function of the application of the acoustic transducer.

In general, there are two possible optimization considerations for the aforesaid characteristics: for low-voltage applications, for example for mobile devices (such as smartphones, tablets, or the like), in which it is more important to obtain a low energy consumption rather than the capability of transducing with low distortion input signals with a high sound level; or for high-fidelity audio-capture applications, in which a high value of AOP is, instead, mainly desired.

In the first case, the interface electronic circuit 1 is designed so as to enable good performance in terms of AOP and PSRR in the presence of low values of the supply voltage $V_{DD}$, for example between 1.6 V and 1.8 V. The voltage-regulator stage 5 is set to generate a regulated voltage $V_r$, for example, of 1.5 V, with a regulator reference voltage $V_{ref\_reg}$ of 1 V. The common-mode voltage $V_{CM}$ at the input of the amplifier stage 4 is, for example, set at a value (which corresponds to approximately half of the regulated voltage) of 0.7 V, with a regulator reference voltage $V_{ref\_reg}$ which is also 0.7 V.

The maximum value of AOP is, in this case, 120-125 dBSPL (considering a sensitivity of −38 dBV/Pa, with 1 Pa=94 dBSPL), and this value does not increase even if the value of the supply voltage $V_{DD}$ is increased, given that the swing of the output voltage $V_{out}$ of the amplifier stage 4 is fixed at the design stage, on the basis of the value of the regulated voltage $V_r$ supplied by the voltage-regulator stage 5.

In the second case, the interface electronic circuit 1 is designed to operate with high swing values of the output voltage $V_{out}$ of the amplifier stage 4, given the high values of the input signals. The voltage-regulator stage 5 is set to generate a regulated voltage $V_r$ of, for example, 2.5 V, with a regulator reference voltage $V_{ref\_reg}$ once again of 1 V. The common-mode voltage $V_{CM}$ at the input of the amplifier stage 4 is, in the example, set at a value (which once again corresponds to approximately half of the regulated voltage) of 1.15 V, with a regulator reference voltage $V_{ref\_reg}$ which is also 1.15 V.

In this case, the interface electronic circuit 1 provides good performance in terms of AOP and PSRR only for values of the supply voltage $V_{DD}$ higher than the regulated voltage $V_r$ (for example, comprised between 2.5 V and 3 V), whereas for lower values of the supply voltage $V_{DD}$, clipping phenomena occur, with consequent low values of PSRR, in so far as the voltage-regulator stage 5 is not operative.

The maximum value of AOP is in this case, for example, 125-132 dBSPL (once again considering a sensitivity of −38 dBV/Pa, with 1 Pa=94 dBSPL), but is obtained only above the correct operating point of the voltage-regulator stage 5.

Basically, the examples illustrated highlight that in both cases considerable limitations exist in the performance of the interface electronic circuit 1.

In particular, as shown in FIG. 2A, in the case of the optimization for low voltage values, the interface electronic circuit 1 provides a constant value of AOP as the supply voltage $V_{DD}$ varies, and a value of PSRR that increases as the supply voltage $V_{DD}$ increases.

As shown in FIG. 2B, in the case of optimization for high AOP, there is a considerable drop in performance, both in terms of AOP and in terms of PSRR as soon as the supply voltage $V_{DD}$ drops below the operating point of the voltage-regulator stage 5 (in this case, for a supply voltage $V_{DD}$ of approximately 2.3 V).

BRIEF SUMMARY

The present Applicant has realized that current solutions, such as discussed previously herein, are not able to effectively manage wide ranges of values of the supply voltage $V_{DD}$ while at the same time providing high performance, for example in terms of PSRR and AOP. In particular, a choice is generally made at the design level between an optimization for low voltage and an optimization for high values of AOP, according to the final application of the interface electronic circuit 1.

A possible solution for solving the above problems may envisage including in the interface electronic circuit 1 a discrimination stage that is able to detect the value of the supply voltage $V_{DD}$ and compare it with a threshold value.

It is thus possible to set, according to the result of the comparison, two distinct operating modes (both of which are pre-set, according to design), which envisage different operating conditions of the amplifier stage 4 with different values of, among other parameters, the regulation voltage $V_r$ and the common-mode voltage $V_{CM}$.

The above solution has, however, a number of disadvantages that mean that its use may not be recommended. Amongst such disadvantages, there may be cited a markedly non-linear behavior as the value of the supply voltage $V_{DD}$ varies. In addition, disturbance on the value of the supply voltage $V_{DD}$ can "trigger" the discrimination stage, in an undesirable manner, and effects of discontinuity and hysteresis may arise, when operating in the proximity of the adopted threshold value.

In various embodiments, the present disclosure provides an interface electronic circuit for an acoustic transducer that will enable the limitations highlighted above affecting known solutions to be overcome.

According to the present disclosure, an interface electronic circuit for an acoustic transducer and a corresponding method are thus provided.

In an embodiment, an interface electronic circuit for a capacitive acoustic transducer having a sensing capacitor is provided that includes an amplifier, a voltage regulator, a common-mode control circuit, and a reference generator. The amplifier has an input coupled to a first electrode of the sensing capacitor. The voltage regulator is configured to receive a regulator reference voltage, generate a regulated voltage based on the regulator reference voltage, and supply the regulated voltage to a supply input of the amplifier. The common-mode control circuit is configured to control a common-mode voltage present on the input of the amplifier based on a common-mode reference voltage. The reference generator is configured to receive a supply voltage and generate the regulator reference voltage and the common-mode reference voltage with respective values that are variable as a function of the supply voltage.

In an embodiment, an electronic device is provided that includes a MEMS acoustic transducer having a sensing capacitor, and an interface electronic circuit. The interface electronic circuit includes an amplifier, a voltage regulator, a common-mode control circuit, and a reference generator. The amplifier has an input coupled to a first electrode of the sensing capacitor. The voltage regulator is configured to receive a regulator reference voltage, generate a regulated voltage based on the regulator reference voltage, and supply the regulated voltage to a supply input of the amplifier. The common-mode control circuit is configured to control a common-mode voltage present on the input of the amplifier based on a common-mode reference voltage. The reference generator is configured to receive a supply voltage and generate the regulator reference voltage and the common-mode reference voltage with respective values that are variable as a function of the supply voltage.

In an embodiment, a method is provided that includes: amplifying, by an amplifier, a capacitive variation of a sensing capacitor of a capacitive acoustic transducer; generating, by a voltage regulator, a regulated voltage based on a regulator reference voltage, and supplying the regulated voltage to a supply input of the amplifier; controlling, by a common-mode control circuit, a common-mode voltage present on the input of said amplifier based on a common-mode reference voltage; and generating, by a reference generator, said regulator reference voltage and said common-mode reference voltage with respective values that are variable as a function of a supply voltage of said capacitive acoustic transducer.

BRIEF DESCRIPTION OF THE SEVERAL VIEWS OF THE DRAWINGS

For a better understanding of the present disclosure, preferred embodiments thereof are now described, purely by way of non-limiting examples, with reference to the attached drawings, wherein.

DETAILED DESCRIPTION

As will be clarified hereinafter, the present disclosure envisages a so-called "ratiometric" design of the interface electronic circuit of the acoustic transducer, in which, that is, the operating point of the amplifier stage, in terms of the output swing, based on the regulated voltage supplied by the voltage-regulator stage, and of the input common-mode value, is rendered variable, with a given ratio, as a function of the value of the supply voltage $V_{DD}$ of the same interface electronic circuit, thus automatically tracking the variations of the supply voltage $V_{DD}$.

In this manner, as the supply voltage $V_{DD}$ increases, the value of the output swing of the amplifier stage and, consequently, the AOP value increase accordingly (on the basis of the ratio determined). Moreover, no degradation in performance occurs, in particular in terms of PSRR and AOP, as the value of the supply voltage $V_{DD}$ varies, in so far as the performance is automatically optimized for any value of the supply voltage $V_{DD}$.

Figure 1:
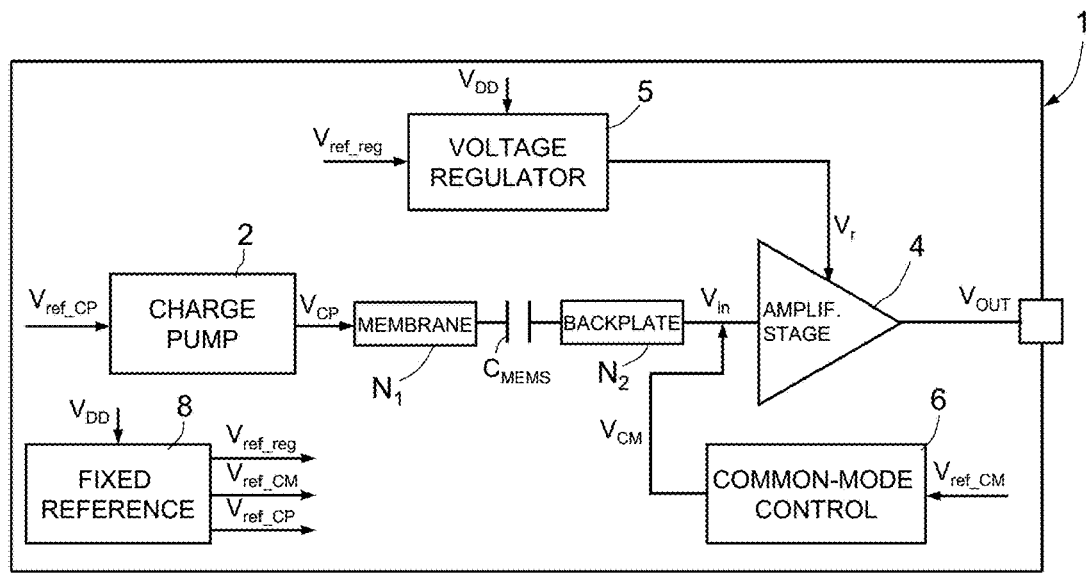
FIG. 1 is a block diagram of an interface electronic circuit of a capacitive acoustic transducer of a known type.
Figure 2A:
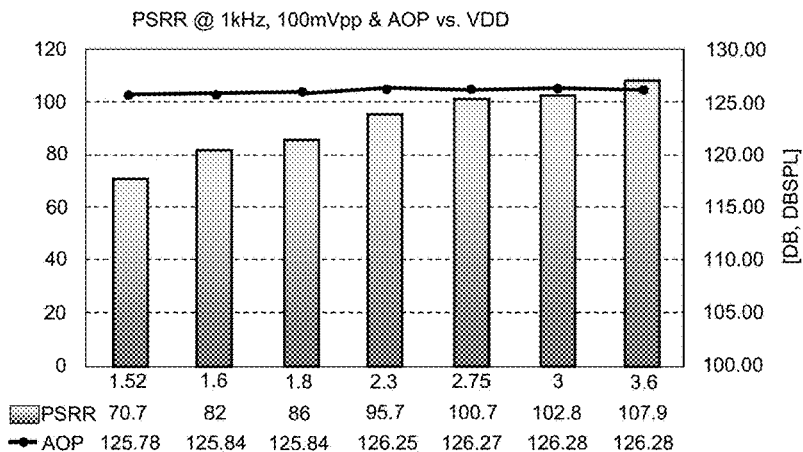
FIGS. 2A and 2B show plots relating to the performance of the interface electronic circuit of FIG. 1, in two different operating configurations.
Figure 2B:
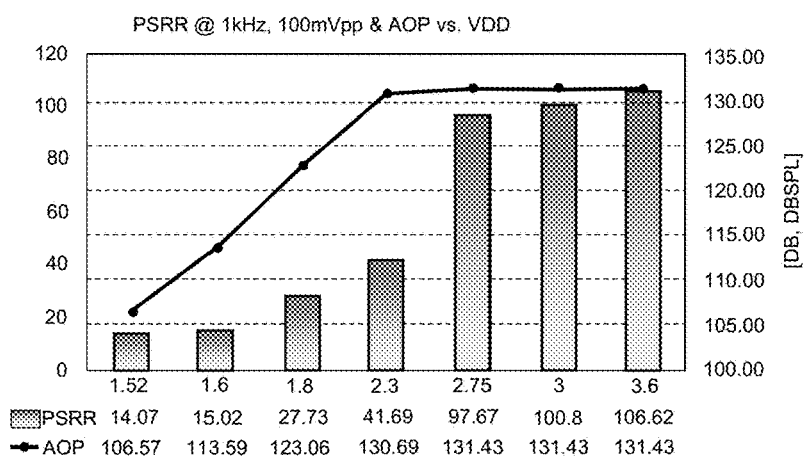
Figure 3:
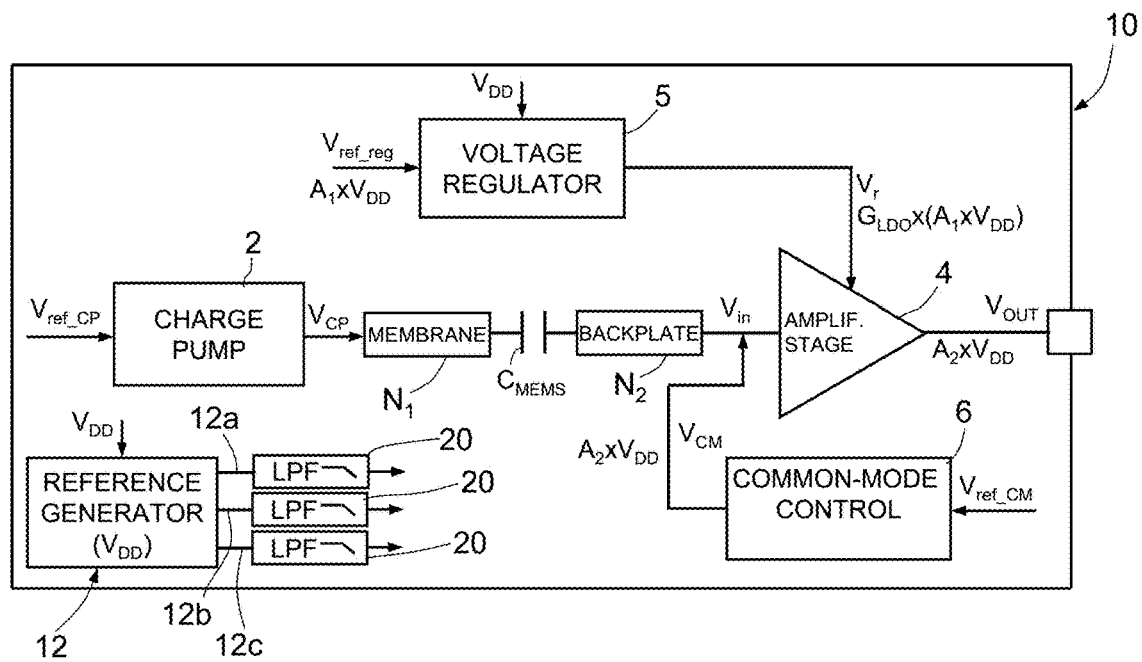
FIG. 3 is a block diagram of an interface electronic circuit of a capacitive acoustic transducer, according to an embodiment of the present disclosure.

FIG. 3 shows an interface electronic circuit, designated by 10, according to one or more embodiments, which, in general, is made in a way similar to the reading-interface electronic circuit 1 described with reference to FIG. 1, hence comprising: the charge-pump stage 2, coupled to the first electrode $N_1$ of the sensing capacitor; the amplifier stage 4, having its input coupled to the second electrode $N_2$ of the sensing capacitor; the voltage-regulator stage 5, for example, an LDO (Low Drop-Out) regulator, which supplies the regulated voltage $V_r$ to the supply input of the amplifier stage 4; and the common-mode-control stage 6, which controls the common-mode voltage $V_{CM}$ at the input of the amplifier stage 4 (in a way altogether similar to what has been described in greater detail previously).

According to one or more embodiments of the present disclosure, the interface electronic circuit 10 further comprises a reference-generator stage 12, configured to generate, on a first output 12a, a second output 12b, and a third output 12c, the values of the regulator reference voltage $V_{ref\_reg}$, the common-mode reference voltage $V_{ref\_CM}$, and the charge-pump reference voltage $V_{ref\_CP}$, respectively, with variable value, appropriately scaled to the value of the supply voltage $V_{DD}$, so as to optimize the performance of the interface electronic circuit 10 (in terms of PSRR, AOP, and SNR) for any value of the supply voltage $V_{DD}$.

As will be described in detail hereinafter, the reference-generator stage 12 is configured to implement the following expressions (which are function of the supply voltage $V_{DD}$) that determine the values of the aforesaid regulator reference voltage $V_{ref\_reg}$, common-mode reference voltage $V_{ref\_CM}$, and charge-pump reference voltage $V_{ref\_CP}$:

$$V_{ref\_reg} = A_1 \times V_{DD};$$

$$V_{ref\_CM} = A_2 \times V_{DD};$$

$$V_{ref\_CP} = V_{bandgap} \times g_1 + (V_{DD} - V_{bandgap}) \times G_m \times g_2.$$

In particular, as shown by the aforesaid expressions, the regulator reference voltage $V_{ref\_reg}$ and the common-mode reference voltage $V_{ref\_CM}$ are determined directly as a ratio of the value of the supply voltage $V_{DD}$ (i.e., in a way proportional to the supply voltage $V_{DD}$), on the basis of a respective multiplicative ratio $A_1$, $A_2$, the value of which is appropriately chosen, for example according to the application and the characteristics of the MEMS structure of the acoustic transducer.

Consequently, the value of the regulated voltage $V_r$ supplied by the voltage-regulator stage 5 is in this case equal to $G_{LDO} \times A_1 \times V_{DD}$, where $G_{LDO}$ is a gain factor of the voltage-regulator stage 5, and the value of the common-mode voltage $V_{CM}$ controlled by the common-mode-control stage 6 at the input of the amplifier stage 4 is in this case equal to $A_2 \times V_{DD}$.

Also the charge-pump reference voltage $V_{ref\_CP}$ is made variable as a function of the value of the supply voltage $V_{DD}$, albeit not in a direct (or proportional) way, resulting in fact, in this case, from the combination of: a first component, which is fixed (in this case equal to $V_{bandgap} \times g_1$) being determined on the basis of a known reference voltage, for example, a bandgap voltage $V_{bandgap}$ supplied by a bandgap generator (of a known type, not described herein); and a second component (in this case equal to $(V_{DD} - V_{bandgap}) \times G_m \times g_2$), which is variable as the supply voltage $V_{DD}$ varies, this component having a much smaller value, in percentage terms, than the first component (for example, being lower than 1% of the aforesaid first component).

This expression for the charge-pump reference voltage $V_{ref\_CP}$ is due to the fact that the boosted voltage $V_{CP}$ at the output from the charge-pump stage 2 (for example, 15 V) is much higher than the charge-pump reference voltage $V_{ref\_CP}$, and it may be desired to have a small variation of the boosted voltage $V_{CP}$, as the value of the supply voltage $V_{DD}$ varies, with respect to its nominal value (for example, a variation in the region of 3%/V).

It should moreover be noted that a substantially matching variation of the voltage values at the terminals of the sensing capacitor may be provided in order to obtain a voltage drop ΔV on the electrodes $N_1$ and $N_2$ of the sensing capacitor that is substantially constant as the supply voltage $V_{DD}$ varies, in so far as this voltage drop ΔV determines the sensitivity of the same sensing capacitor.

Figure 4:
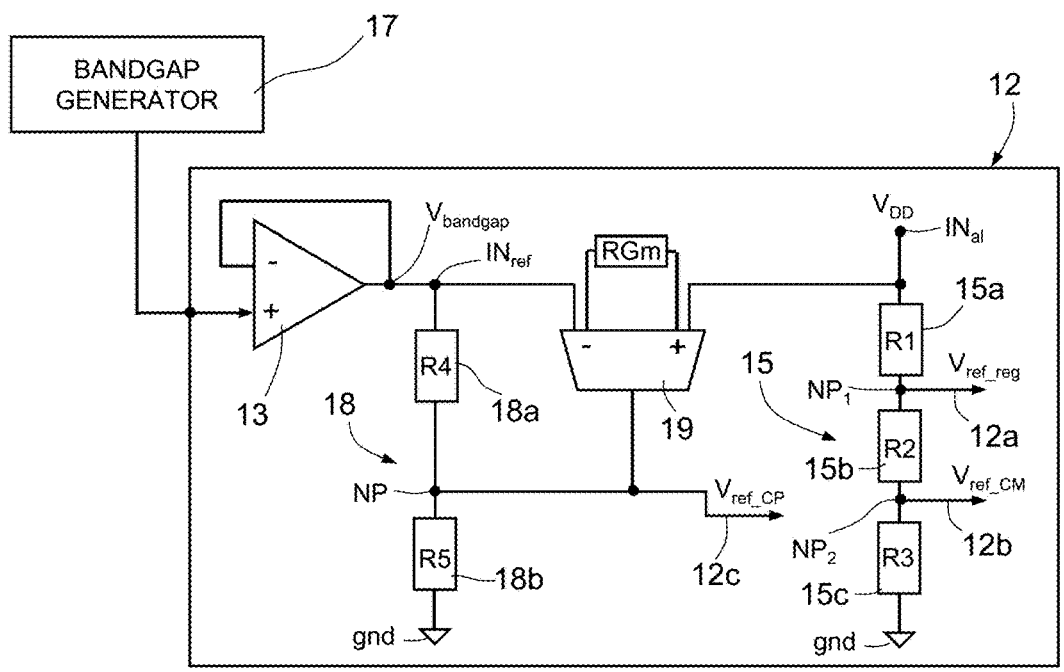
FIG. 4 is a block diagram of a reference-generator stage, in the circuit of FIG. 3.

In greater detail, and as shown in FIG. 4, in a possible circuit implementation, the reference-generator stage 12 has a supply input $IN_{al}$, on which it receives the supply voltage $V_{DD}$, and comprises a first voltage divider 15, coupled to the supply input $IN_{al}$, designed to supply, on the first and second outputs 12a, 12b of the reference-generator stage 12, the regulator reference voltage $V_{ref\_reg}$ and the common-mode reference voltage $V_{ref\_CM}$, as a division of the supply voltage $V_{DD}$, implementing a divider ratio corresponding to the respective multiplicative ratio $A_1$, $A_2$.

In particular, the first voltage divider 15 comprises: a first divider resistor 15a, with resistance $R_1$, connected between the supply input $IN_{al}$ and a first divider node $NP_1$, which coincides with the first output 12a; a second divider resistor 15b, with resistance $R_2$, connected between the first divider node $NP_1$ and a second divider node $NP_2$, which coincides with the second output 12b; and a third divider resistor 15c, with resistance $R_3$, connected between the second divider node $NP_2$ and a ground reference gnd of the interface electronic circuit 10.

It should be noted that the values of the first, second, and third resistances $R_1$, $R_2$, $R_3$ are chosen so as to ensure a high impedance between the supply input $IN_{al}$ set at the supply voltage $V_{DD}$ and the ground reference gnd, so as to minimize absorption of electric current by the supply input $IN_{al}$.

In a way that will emerge clearly, the first divider ratio, coinciding with the multiplicative ratio $A_1$, is given by $(R_2+R_3)/(R_1+R_2+R_3)$, whereas the second divider ratio, coinciding with the multiplicative ratio $A_2$, is given by $(R_3)/(R_1+R_2+R_3)$.

The reference-generator stage 12 moreover has a reference input $IN_{ref}$, coupled to a bandgap generator 17 (of a known type, not described herein) by means of a buffer, or voltage follower, block 13. Hence, a reference voltage of a stable and precise value is present on the reference input $IN_{ref}$, in particular the bandgap voltage $V_{bandgap}$.

The reference-generator stage 12 further comprises a second voltage divider 18 and a transconductance block 19.

The second voltage divider 18 is coupled to the reference input $IN_{ref}$ and is formed by: a respective first divider resistor 18a, with resistance $R_4$, connected between the reference input $IN_{ref}$ and a divider node NP, which in this case is directly connected to the third output 12c; and a respective second divider resistor 18b, with resistance $R_5$, connected between the divider node NP and the ground reference gnd.

The transconductance block 19 has a transconductance $G_m$ (equal to $1/RG_m$), a first (positive) comparison input connected to the supply input $IN_{al}$, a second (negative) comparison input connected to the reference input $IN_{ref}$, and an output in this case directly connected to the third output 12c of the reference-generator stage 12.

The first (fixed) component of the charge-pump reference voltage $V_{ref\_CP}$ is hence generated at the third output 12c via division of the bandgap voltage $V_{bandgap}$ by the second voltage divider 18; in particular, this first component is given by $V_{bandgap} \times g_1$, where the factor $g_1$ is the division factor defined by $R_5/(R_4+R_5)$.

On the same third output 12c, the second (variable) component of the charge-pump reference voltage $V_{ref\_CP}$ is moreover generated, by means of the transconductance block 19, which senses the voltage difference between the supply voltage $V_{DD}$ and the bandgap voltage $V_{bandgap}$, and injects a current, proportional to this voltage difference and multiplied by the transconductance $G_m$, on the divider node NP defined by the second voltage divider 18. This current is multiplied by the impedance "seen" at said divider node NP, given by $R_4 \| R_5$ (i.e., by the parallel of the resistances $R_4$ and $R_5$ of the first and second divider resistors 18a, 18b), thus determining the aforesaid second component of the charge-pump reference voltage $V_{ref\_CP}$.

Basically, as mentioned previously, the second component, which is variable as a function of the supply voltage $V_{DD}$, is given by $$(V_{DD}-V_{bandgap}) \times G_m \times g_2,$$

where the factor $g_2$ is in this case given by the aforesaid parallel of resistances $R_4 \| R_5$.

According to some embodiments of the present disclosure (see again FIG. 3), the interface electronic circuit 10 further comprises a filtering stage 20 coupled to each of the first, second, and third outputs 12a, 12b, 12c of the reference-generator stage 12 and configured to carry out a low-pass filtering of the regulator reference voltage $V_{ref\_reg}$, of the common-mode reference voltage $V_{ref\_CM}$, and of the charge-pump reference voltage $V_{ref\_CP}$, respectively, before these same reference voltages are supplied to the voltage-regulator stage 5, to the common-mode-control stage 6, and to the charge-pump stage 2, respectively.

Each filtering stage 20 has a cut-off frequency that is very low, typically lower than 1 Hz, for example 0.1 Hz, and has the task of cutting off the frequencies higher than a few Hz so as to effectively filter any possible disturbance coming from the supply voltage $V_{DD}$ (given that the aforesaid reference voltages are generated in a variable manner, as a function of the supply voltage $V_{DD}$), so as to ensure a high value of PSRR over the entire audio bandwidth (20 Hz-20 kHz).

Figures 5, 6:
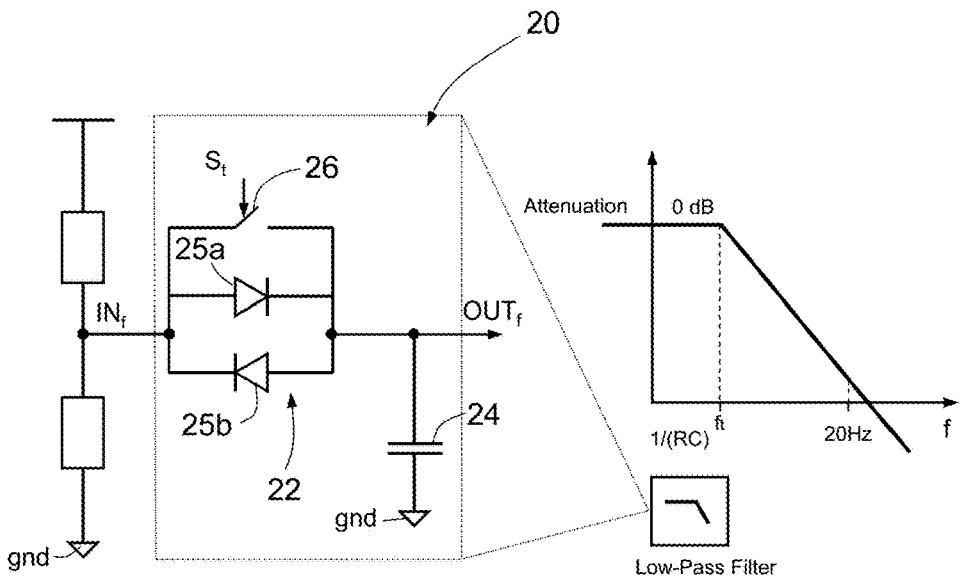
FIG. 5 is a block diagram of a filter stage, in the circuit of FIG. 3.
FIG. 6 shows the transfer function of the filter stage of FIG. 5.

In a possible circuit implementation, illustrated in FIG. 5, each filtering stage 20 has a filter input $IN_f$, which is designed to receive the respective reference voltage from among the aforesaid regulator reference voltage $V_{ref\_reg}$, common-mode reference voltage $V_{ref\_CM}$, and charge-pump reference voltage $V_{ref\_CP}$, and in particular is coupled to a respective divider node (as illustrated schematically in FIG. 5), defined by the first voltage divider 15 or by the second voltage divider 18 of the reference-generator stage 12 (see the foregoing discussion).

The filtering stage 20 comprises: a high-impedance block 22, connected between the filter input $IN_f$ and a filter output $Out_f$ of the same filtering stage, on which it supplies the respective filtered reference voltage; and a capacitor element 24, connected between the filter output $Out_f$ and the ground reference gnd.

The high-impedance block 22 and the capacitor element 24 jointly provide a high filtering time constant in order to implement the low-pass filtering action.

In particular, given the unfeasibility of providing resistors with very high impedance in an integrated implementation, the aforesaid high-impedance block 22 is here provided by means of a pair formed by a first diode element 25a and a second diode element 25b, connected together in parallel, between the filter input $IN_f$ and the filter output $Out_f$. In detail, the first diode element 25a has its anode connected to the filter input $IN_f$ and its cathode connected to the filter output $Out_f$, and the second diode element 25b has its anode connected to the filter output $Out_f$ and its cathode connected to the filter input $IN_f$.

The first and second diode elements 25a, 25b are zero-current biased, so as to provide jointly, across them, an impedance of an extremely high value.

FIG. 6 shows the transfer function of the filtering stage 20, where in particular the low cut-off frequency is highlighted, designated by $f_t$, which is much lower than the minimum limit of the audio bandwidth (20 Hz), and moreover the presence of a zero attenuation (0 dB) below the same cut-off frequency.

According to one or more embodiments of the present disclosure (see again FIG. 5), the filtering stage 20 further comprises a switch element 26, connected in parallel to the first and second diode elements 25a, 25b of the high-impedance block 22, controlled by a timing signal $S_t$.

In particular, the timing signal $S_t$ is such as to drive, for a start-up time interval, for example, of the duration of a few milliseconds, closing of the switch element 26, upon start-up or power-on of the interface electronic circuit 10, or upon resumption of the interface electronic circuit 10 from a stand-by or power-down condition, hence creating, for the duration of the same start-up time interval, a low-impedance direct connection between the filter input $IN_f$ and the filter output $Out_f$.

In this manner, it is possible to speed up considerably the start-up transient, which otherwise would be very long on account of the high impedance value of the high-impedance block 22 and on account of the consequent long settling time of the voltage value across the capacitor element 24.

Each filtering stage 20 is hence de-activated during the start-up time interval, and is then activated only when the respective reference voltage has settled around its own DC value. In this situation, the switch element 26 is opened by the timing signal $S_t$. It is thus possible to reset the filtering stage 20, i.e., guarantee that the low-pass filter is in the correct operating region with a minimum delay from start-up or from resumption after power-down.

The advantages of the various embodiments provided by the present disclosure emerge clearly from the foregoing description.

In any case, it is again emphasized that the present disclosure enables the limitations of known interface electronic circuits (which are optimized either in regard to low voltage or, alternatively, in regard to high values of AOP) to be overcome, affording good performance in terms of PSRR and AOP for any possible value of the supply voltage $V_{DD}$.

Figure 7:
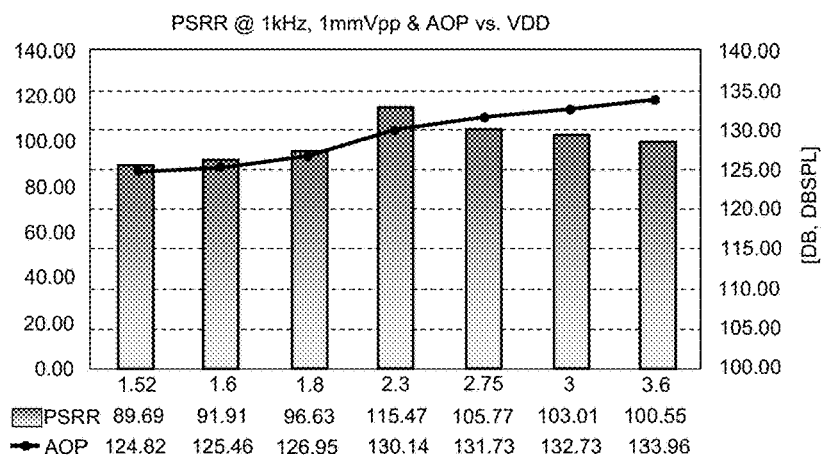
FIGS. 7 and 8 show plots relating to the performance of the interface electronic circuit of FIG. 3.

The performance of the interface electronic circuit 10 according to one or more embodiments of the present disclosure is shown in FIG. 7, in particular in terms of the values of PSRR and AOP as the supply voltage $V_{DD}$ varies.

It is noted, in particular, that the performance in terms of PSRR is always good (even for low values of the supply voltage $V_{DD}$) and that the value of AOP increases as the supply voltage $V_{DD}$ increases, thus making it possible to exploit the increase in the same supply voltage $V_{DD}$.

Figure 8:
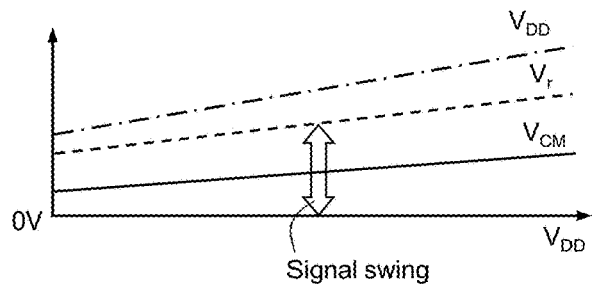

In this regard, FIG. 8 moreover illustrates the increase in the useful signal swing, at the output from the amplifier stage 4 of the interface electronic circuit 10, as the supply voltage $V_{DD}$ increases, which is afforded by the "ratiometric" architecture discussed above.

The various embodiments of the present disclosure hence enables elimination of the need to choose between two architectures of the acoustic transducer, providing a single design method that is able to operate in an optimized way over the entire range of available supply voltages $V_{DD}$.

Figure 9:
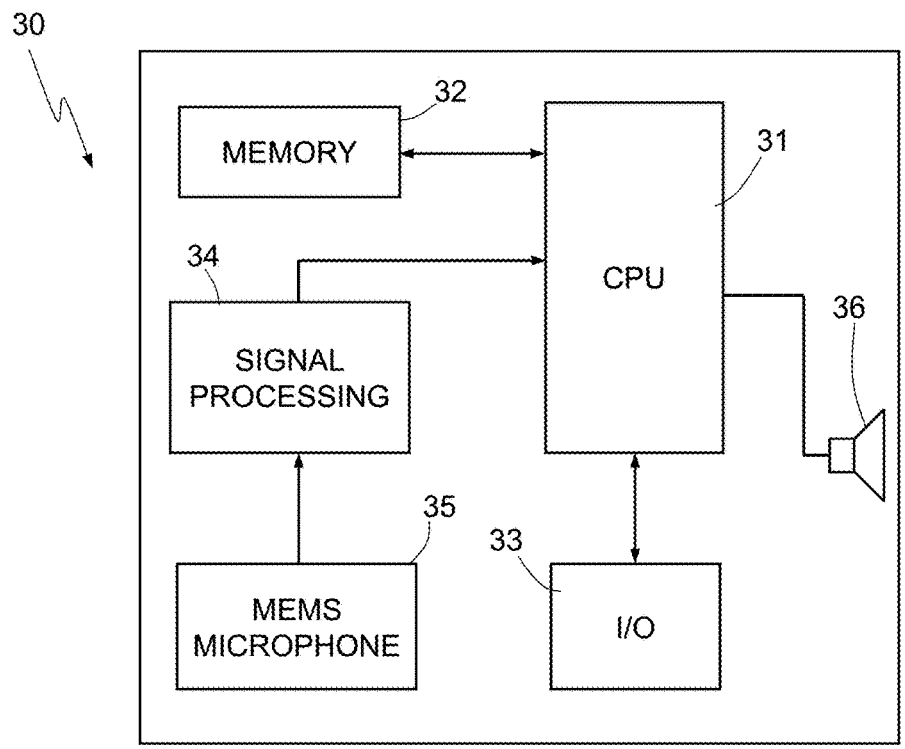
FIG. 9 is a general block diagram of an electronic device incorporating a capacitive acoustic transducer and the corresponding interface electronic circuit.

The characteristics listed previously make use of the interface electronic circuit 10 and of the corresponding acoustic transducer particularly advantageous in an electronic device 30, as shown in FIG. 9 (this electronic device 30 may possibly comprise further acoustic transducers or even further types of sensors, in a way not illustrated).

The electronic device 30 is preferably a mobile communication device, such as a mobile phone, a PDA, a notebook, but also a voice recorder, a reader of audio files with voice-recording capacity, etc. Alternatively, the electronic device 30 may be a hydrophone, capable of working under water, or a hearing-aid device.

The electronic device 30 comprises a microprocessor 31, a memory block 32, coupled to the microprocessor 31, and an input/output interface 33, for example, provided with a keyboard and a display, which is also connected to the microprocessor 31. The acoustic transducer, or MEMS microphone, here designated by 35, communicates with the microprocessor 31 via a signal-processing block 34 (which comprises the interface electronic circuit 10 previously described or is operatively coupled thereto). Moreover, a speaker 36 may be present, for generating sounds on an audio output (not shown) of the electronic device 30.

Finally, it is clear that modifications and variations may be made to what has been described and illustrated herein, without thereby departing from the scope of the present disclosure.

Figure 10:
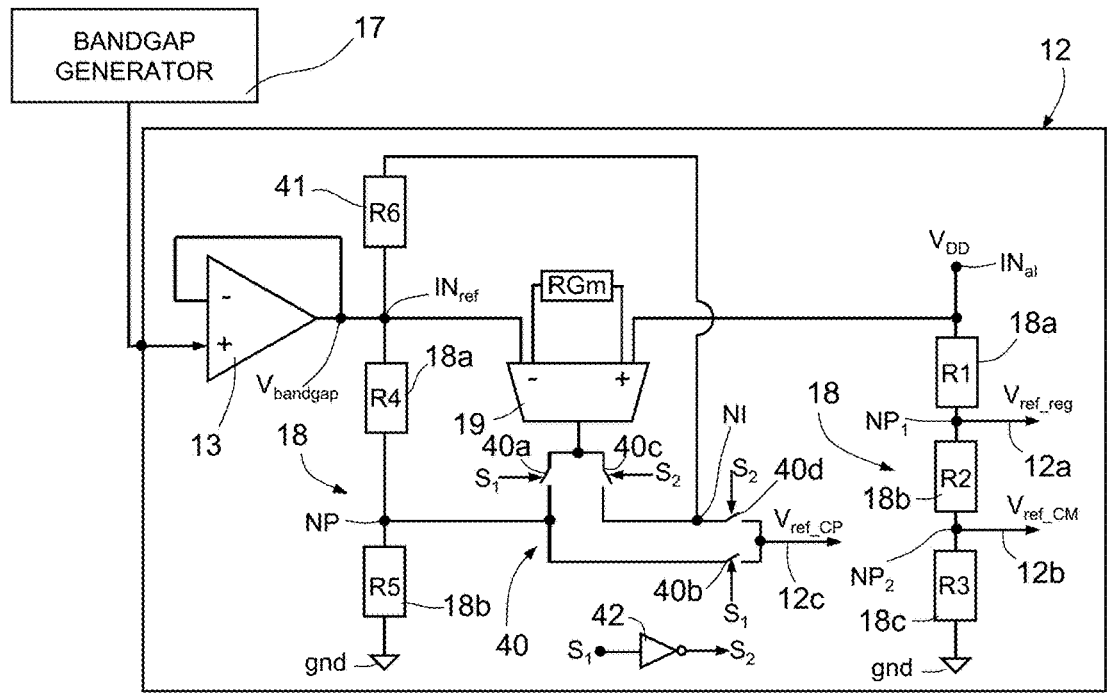
FIG. 10 is a block diagram of a reference-generator stage, according to an embodiment of the present disclosure.

In particular, as shown in FIG. 10, an alternative embodiment of the reference-generator stage 12 of the interface electronic circuit 10 may be envisaged.

This embodiment envisages the possibility of generating two distinct values for the charge-pump reference voltage $V_{ref\_CP}$, one of which is higher than the bandgap voltage $V_{bandgap}$.

In this case, the reference-generator stage 12 comprises, in addition to what has already been described in detail with reference to FIG. 4, a selector stage 40, coupled to the output of the transconductance block 19, and moreover a further resistor element 41, having resistance $R_6$, which is connected to the reference input $IN_{ref}$.

In detail, the selector stage 40 comprises: a first switch element 40a, connected between the aforesaid output of the transconductance block 19 and the divider node NP of the second voltage divider 18 and controlled by a first control signal $S_1$; a second switch element 40b, connected between the divider node NP of the second voltage divider 18 and the third output 12c of the reference-generator stage 12 and controlled by the first control signal $S_1$; a third switch element 40c, connected between the aforesaid output of the transconductance block 19 and an internal node NI of the selector stage 40 and controlled by a second control signal $S_2$; and a fourth switch element 40d, connected between the internal node NI and the third output 12c of the reference-generator stage 12 and controlled by the second control signal $S_2$.

The second control signal $S_2$ is the negated version of the first control signal $S_1$, being generated starting from the first control signal $S_1$ by means of a logic-inverter block 42.

The further resistor element 41 is connected between the aforesaid reference input $IN_{ref}$ and the internal node NI of the selector stage 40.

In the case where the first and second switch elements 40a, 40b are closed (and consequently the third and fourth switch elements 40c, 40d are open), the reference-generator stage 12 is altogether equivalent to what has been described previously, with reference to FIG. 4, hence determining generation of a first value of the charge-pump reference voltage $V_{ref\_CP}$, given by the following expression, discussed in detail previously:

$$V_{ref\_CP} = V_{bandgap} \times g_1 + (V_{DD} - V_{bandgap}) \times G_m \times g_2$$

In particular, this first value of the charge-pump reference voltage $V_{ref\_CP}$ is lower than the value of the bandgap voltage $V_{bandgap}$.

In the case where the first and second switch elements 40a, 40b are, instead, open (and consequently the third and fourth switch elements 40c, 40d are closed), operation of the reference-generator stage 12 is described in what follows.

The current generated by the transconductance block 19 (which tracks the difference between the supply voltage $V_{DD}$ and the bandgap voltage $V_{bandgap}$) is injected into the further resistor element 41 (instead of into the divider node NP of the second voltage divider 18), thus determining a corresponding voltage drop that in this case adds directly to the bandgap voltage $V_{bandgap}$.

Hence, in this case, a second value of the charge-pump reference voltage $V_{ref\_CP}$ is obtained, higher than the bandgap voltage $V_{bandgap}$ and given by the following expression:

$$V_{ref\_CP} = V_{bandgap} = (V_{DD} - V_{bandgap}) \times G_m \times R_6$$

This embodiment is particularly advantageous in the case where, via one and the same interface electronic circuit 10, biasing and reading of two different types of MEMS detection structures of the acoustic transducer is employed, which may have different biasing considerations, enabling the possibility of selecting each time the first value or the second value of the charge-pump reference voltage $V_{ref\_CP}$.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An interface electronic circuit for a capacitive acoustic transducer having a sensing capacitor, comprising:
   an amplifier having an input coupled to a first electrode of said sensing capacitor;
   a voltage regulator configured to receive a regulator reference voltage, generate a regulated voltage based on the regulator reference voltage, and supply the regulated voltage to a supply input of said amplifier;
   a common-mode control circuit configured to control a common-mode voltage present on said input of said amplifier based on a common-mode reference voltage; and
   a reference generator configured to receive a supply voltage and generate said regulator reference voltage and said common-mode reference voltage with respective values that are variable as a function of said supply voltage,
   wherein the reference generator is configured to generate said regulator reference voltage and said common-mode reference voltage proportional to said supply voltage, as a product of said supply voltage by a first multiplicative factor and a second multiplicative factor, respectively.

2. The circuit according to claim 1, further comprising a charge pump coupled to a second electrode of said sensing capacitor and configured to generate a boosted voltage based on said supply voltage and on a charge pump reference voltage, wherein said reference generator is configured to generate said charge pump reference voltage with a value that is variable as a function of said supply voltage.

3. The circuit according to claim 2, wherein the reference generator is configured to generate said charge-pump reference voltage as a combination of: a first component, which is fixed as said supply voltage varies and is generated based on a voltage reference; and a second component, which is variable as a function of the supply voltage, wherein said second component has a value lower than the first component.

4. The circuit according to claim 3, wherein said second component has a value lower than 1% of said first component.

5. The circuit according to claim 3, wherein said second component is equal to a difference between the supply voltage and the voltage reference multiplied by a respective multiplicative factor.

6. The circuit according to claim 2, further comprising a filter configured to implement a low-pass filtering of said regulator reference voltage, said common-mode reference voltage, and said charge-pump reference voltage generated by the reference generator, wherein said filter includes:
   a filtering input;
   a filtering output;
   a high-impedance circuit connected between said filtering input and said filtering output;
   a capacitor connected to said filtering output; and
   a switch connected in parallel to said high-impedance circuit and driven by a timing signal into a closed condition for a start-up time interval during a start-up phase of said interface electronic circuit and into an open condition outside said start-up time interval.

7. The circuit according to claim 6, wherein said start-up time interval occurs at start-up or power-on of said interface electronic circuit or upon resumption from a stand-by or power-down condition.

8. The circuit according to claim 2, wherein said reference generator comprises:
   a supply input configured to receive the supply voltage; and
   a first voltage divider coupled to the supply input, the first voltage divider having a first divider node, coupled to a first output of said reference generator, which outputs said regulator reference voltage, and a second divider node, coupled to a second output of said reference generator, which outputs said common-mode reference voltage.

9. The circuit according to claim 8, wherein said reference generator further comprises:
   a reference input configured to receive a voltage reference;
   a second voltage divider coupled to the reference input, the second voltage divider having a third divider node, coupled to a third output of said reference generator, which outputs said charge-pump reference voltage; and
   transconductance circuitry having a transconductance, a first comparison input coupled to the supply input, a second comparison input coupled to the reference input, and an output coupled to said third output of said reference generator.

10. The circuit according to claim 9, wherein said reference generator is configured to generate two distinct values for said charge-pump reference voltage, of which a first value is lower and a second value is higher than the voltage reference, and the reference generator further comprises:
   a selector circuit coupled to the output of said transconductance circuitry; and a resistor connected to said reference input,
wherein said selector circuit is selectively supply one of the first value or the second value of said charge-pump reference voltage to said third output of said reference generator.

11. The circuit according to claim 10, wherein said selector circuit comprises:
a first switch connected between the output of the transconductance circuitry and the third divider node, the first switch configured to be controlled by a first control signal;
a second switch connected between the third divider node and said third output, the second switch configured to be controlled by said first control signal;
a third switch connected between the output of the transconductance circuitry and an internal node of said selector circuit, the third switch configured to be controlled by a second control signal, the second control signal being inverted with respect to the first control signal; and
a fourth switch connected between the internal node and said third output, the fourth switch configured to be controlled by said second control signal,
wherein said resistor is connected between said reference input and said internal node.

12. An electronic device, comprising:
a MEMS acoustic transducer having a sensing capacitor; and
an interface electronic circuit, the interface electronic circuit including:
an amplifier having an input coupled to a first electrode of the sensing capacitor;
a voltage regulator configured to receive a regulator reference voltage, generate a regulated voltage based on the regulator reference voltage, and supply the regulated voltage to a supply input of the amplifier;
a common-mode control circuit configured to control a common-mode voltage present on the input of the amplifier based on a common-mode reference voltage; and
a reference generator configured to receive a supply voltage and generate the regulator reference voltage and the common-mode reference voltage with respective values that are variable as a function of the supply voltage,
a microprocessor electrically coupled to the interface electronic circuit; and
a computer-readable memory electrically coupled to the microprocessor.

13. The electronic device of claim 12, wherein the electronic device comprises at least one of: a mobile phone, a personal digital assistant (PDA), a notebook computer device, a voice recorder, a voice recorder device, a hydrophone, or a hearing-aid device.

14. A method, comprising:
amplifying, by an amplifier, a capacitive variation of a sensing capacitor of a capacitive acoustic transducer;
generating, by a voltage regulator, a regulated voltage based on a regulator reference voltage, and supplying the regulated voltage to a supply input of the amplifier;
controlling, by a common-mode control circuit, a common-mode voltage present on the input of said amplifier based on a common-mode reference voltage; and
generating, by a reference generator, said regulator reference voltage and said common-mode reference voltage with respective values that are variable as a function of a supply voltage of said capacitive acoustic transducer,
wherein the generating said regulator reference voltage and said common-mode reference voltage includes generating, said regulator reference voltage and said common-mode reference voltage proportional to said supply voltage, as a product of said supply voltage by a first multiplicative factor and by a second multiplicative factor, respectively.

15. The method according to claim 14, further comprising:
generating, by a charge pump coupled to an electrode of said sensing capacitor, a boosted voltage based on said supply voltage and on a charge-pump reference voltage; and
generating, by the reference generator, said charge-pump reference voltage with a value that is variable as a function of said supply voltage.

16. The method according to claim 15, wherein generating said charge-pump reference voltage includes generating said charge-pump reference voltage as a combination of: a first component, which is fixed as said supply voltage varies and is generated on based on a voltage reference; and a second component, which is variable as a function of the supply voltage and has a value lower than the first component.

17. The method according to claim 14, further comprising:
low-pass filtering said regulator reference voltage, said common-mode reference voltage, and said charge-pump reference voltage, wherein said low-pass filtering is de-activated during a start-up time interval of an interface electronic circuit coupled to said capacitive acoustic transducer.

18. The electronic device of claim 12, wherein the reference generator is configured to generate the regulator reference voltage and the common-mode reference voltage proportional to the supply voltage, as a product of the supply voltage by a first multiplicative factor and a second multiplicative factor, respectively.

19. The electronic device of claim 12, wherein the interface electronic circuit further includes a charge pump coupled to a second electrode of the sensing capacitor and configured to generate a boosted voltage based on the supply voltage and on a charge pump reference voltage, wherein the reference generator is configured to generate the charge pump reference voltage with a value that is variable as a function of the supply voltage.

20. The electronic device of claim 19, wherein the reference generator is configured to generate the charge-pump reference voltage as a combination of: a first component, which is fixed as the supply voltage varies and is generated based on a voltage reference; and a second component, which is variable as a function of the supply voltage, wherein the second component has a value lower than the first component.

* * * * *